(12) United States Patent
Chen

(10) Patent No.: US 7,224,069 B2
(45) Date of Patent: May 29, 2007

(54) DUMMY STRUCTURES EXTENDING FROM SEAL RING INTO ACTIVE CIRCUIT AREA OF INTEGRATED CIRCUIT CHIP

(75) Inventor: Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 11/188,323

(22) Filed: Jul. 25, 2005

(65) Prior Publication Data

US 2007/0018331 A1      Jan. 25, 2007

(51) Int. Cl.
*H01L 23/48* (2006.01)

(52) U.S. Cl. .................................................. 257/774
(58) Field of Classification Search ............... None
See application file for complete search history.

(56) References Cited

U.S. PATENT DOCUMENTS

| | | | |
|---|---|---|---|
| 6,372,409 B1 | 4/2002 | Yu | |
| 6,452,274 B1 | 9/2002 | Hasegawa et al. | |
| 6,468,894 B1 | 10/2002 | Yang et al. | |
| 6,570,243 B1 | 5/2003 | Hagihara | |
| 6,624,063 B2 | 9/2003 | Hasegawa et al. | |
| 2003/0116852 A1 | 6/2003 | Watanabe et al. | |
| 2003/0122235 A1 | 7/2003 | Tsai et al. | |
| 2004/0113238 A1 | 6/2004 | Hasunuma et al. | |
| 2004/0150070 A1 | 8/2004 | Okada et al. | |
| 2004/0173905 A1 | 9/2004 | Kamoshima et al. | |
| 2004/0188845 A1 | 9/2004 | Iguchi et al. | |

FOREIGN PATENT DOCUMENTS

JP      2002-208676      * 10/2001

* cited by examiner

*Primary Examiner*—Leonardo Andujar
*Assistant Examiner*—Krista Soderholm
(74) *Attorney, Agent, or Firm*—Slater & Matsil, L.L.P.

(57) ABSTRACT

An integrated circuit chip is provided, which includes an active circuit area, a seal ring structure, and a first dummy structure. The seal ring structure is formed at least partially around the active circuit area. The first dummy structure extends from the seal ring structure into the active circuit area. Other dummy structures that are not directly joined to the seal ring structure at a given level may be provided also to further fill in spaces between active wiring. A software algorithm included in a layout tool may allow for automatically laying out such structures in accordance with predetermined layout design rules.

20 Claims, 7 Drawing Sheets

DUMMY STRUCTURES EXTENDING FROM SEAL RING INTO ACTIVE CIRCUIT AREA OF INTEGRATED CIRCUIT CHIP

TECHNICAL FIELD

The present invention generally relates to dummy structures for mechanically strengthening an integrated circuit chip. More specifically, it relates to dummy structures extending from a seal ring into an active circuit area of an integrated circuit chip.

BACKGROUND

Integrated circuit (IC) chips are often electrically connected by wires (e.g., gold or aluminum wires) to a leadframe or a substrate in a packaging assembly to provide external signal exchange. Such wires are typically wire bonded to bond pads formed on an IC chip using thermal compression and/or ultrasonic vibration. A wire bonding process exerts thermal and mechanical stresses on a bond pad and on the underlying intermetal dielectric (IMD) layers and structure below the bond pad. The bond pad structure and IMD layers need to be able to sustain these stresses to ensure a good bonding of the wire and to prevent damage to the IC chip.

Prior bond pad structures were fabricated from the bottom to the top layers, which did not allow metal wiring circuitry and semiconductor devices to pass under or be located below the bond pad structure. For a more efficient use of chip area or to reduce the chip size, it is desirable to form semiconductor devices and metal wiring circuitry under the bond pads. This is sometimes referred to as bond over active circuits (BOAC) or circuits under pad (CUP). At the same time, many processes now use low-k and ultra low-k dielectric materials for the IMD layers to reduce RC delay and parasitic capacitances. The general trend in IMD designs is that the dielectric constant (k) tends to decrease from the top downward toward the substrate. However, as the dielectric constant (k) decreases, typically the strength of the dielectric material decreases (as a general rule). Hence, many low-k dielectric materials are highly susceptible to cracking or lack strength needed to withstand some mechanical processes (e.g., wire bonding, CMP). Not only do low-k dielectric materials tend to be relatively weak in compression strength, they also tend to be weak in adhesion strength and shearing strength, which can cause peeling or delamination.

During a typical wire bonding procedure, the bond pad structure must withstand compressive and lateral shear forces during the ball squishing stage of wire bonding. These forces may cause cracking in the relatively weak low-k dielectric layers. The bond pad structure must also withstand pulling and torsional forces while the wire is being pulled from the wire bonding tool relative to the bond pad on the chip. These forces may cause peeling or dislocation of the bond pad structure.

Currently dummy structures are included between and among the active circuit structures to strengthen the layers of the chip. Such dummy structures are typically made from the same materials as the active wiring and bond pad structures and are typically formed simultaneously with the formation of the active wiring and bond pad structures. This has greatly helped in strengthening chips and reduced the likelihood of cracking and peeling.

When the chips are cut from a wafer, the chips again experience large mechanical stresses, such as compressive and shearing stresses. Such stresses can also cause cracking, peeling, delamination, or even relatively large chunks of the chip to be removed. To account for such stresses, street areas reserved for the path of cutting tools are allocated on the wafer between chips. But for maximizing the number of chips per wafer, it is desirable to minimize the width of the streets reserved for cutting area. At the same time, the extensive use of low-k dielectric materials has greatly weakened the IMD layers, which calls for wider streets. To address this issue, seal rings have been implemented. A seal ring is typically a wall like structure formed around the perimeter of the chip. Often the seal ring is made from metal and/or polysilicon while forming other conductive structures in a layer.

There is a need for a bond pad structure that can sustain and better disperse the stresses exerted on it by a wire bonding process and/or a cutting process, for example, that is compatible with the use of low-k dielectric materials for IMD layers, and that will also allow circuitry and devices to be formed under the bond pads.

SUMMARY OF THE INVENTION

The problems and needs outlined above may be addressed by embodiments of the present invention. In accordance with one aspect of the present invention, an integrated circuit chip is provided, which includes an active circuit area, an integrated circuit, a seal ring structure, and a first dummy structure. The integrated circuit formed in the active circuit area. The seal ring structure is formed at least partially around the active circuit area. The first dummy structure extends from the seal ring structure into the active circuit area. At least part of the integrated circuit is preferably located under a bond pad in the active area. The seal ring structure is formed at least partially around the active circuit area. The first dummy structure extends from the seal ring structure into the active circuit area.

In accordance with still another aspect of the present invention, a method of making an integrated circuit chip, is provided. This method includes the following steps described in this paragraph. The order of the steps may vary, may be sequential, may overlap, may be in parallel, and combinations thereof. Wiring is formed at a certain level for an integrated circuit in an active area of the chip. At least part of a seal ring structure is formed at least partially around the active circuit area at the certain level. Dummy structures are formed that extend from the seal ring structure into the active circuit area at the certain level. Placements of the dummy structures are selected to minimize dielectric material areas between the wiring and the seal ring at the certain level.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
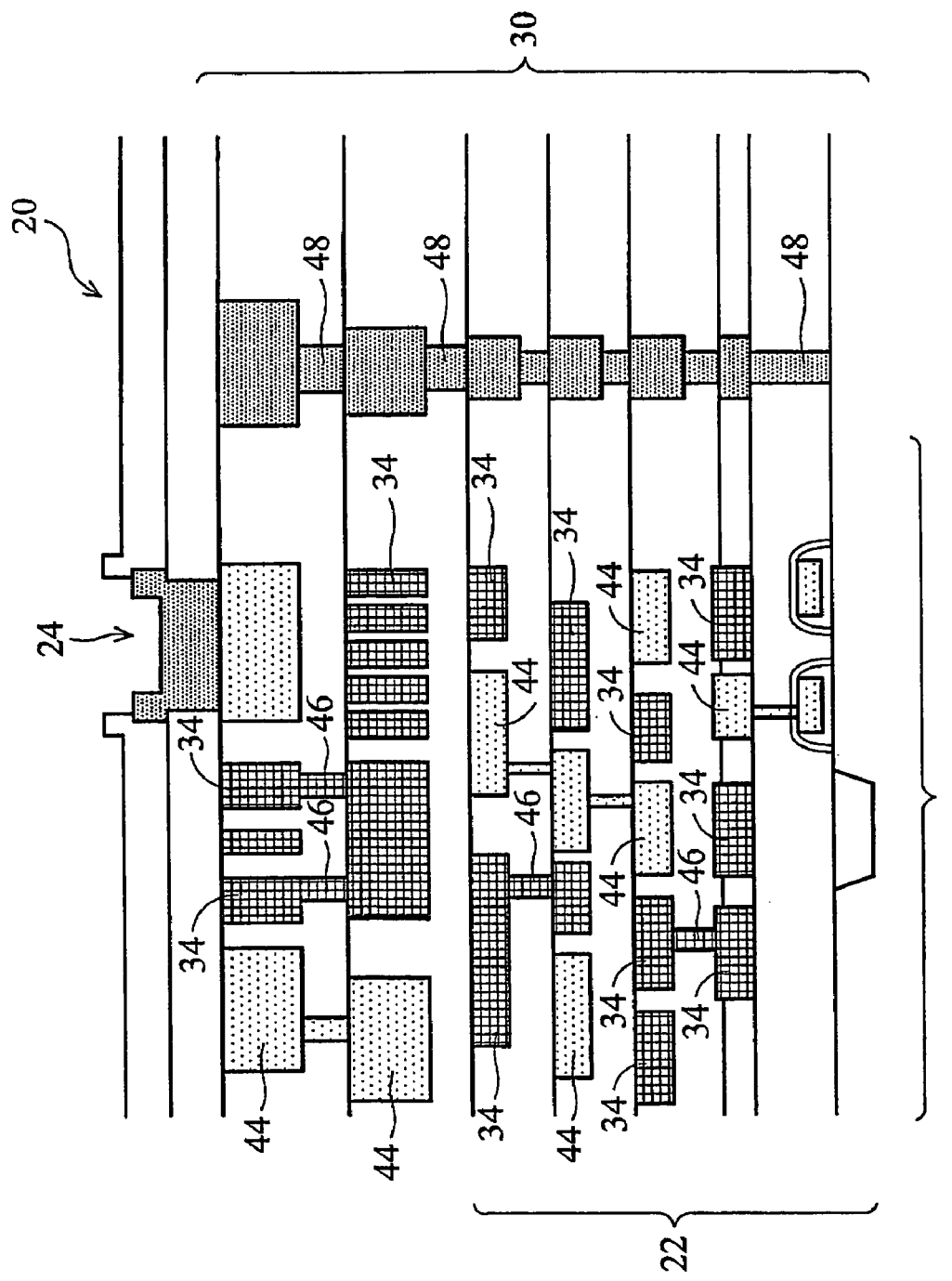
FIG. 1 is a cross-section view showing a portion of an integrated circuit chip.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIG. 1 is a cross-section view showing a portion of an integrated circuit chip. The chip 20 of FIG. 1 has portions of active circuits (of an integrated circuit) 22 formed under the bond pads 24. As illustrated in FIG. 1, part of a seal ring 30 is shown, which extends about the perimeter of the chip 20 around the active area(s) 32. Also, FIG. 1 shows example dummy structures 34 dispersed throughout the active area(s) 32 of the chip 20. Dummy structures 34 and seal rings 30 have been used in chips 20, but always as separate members (i.e., not connected or joined).

Figure 2:
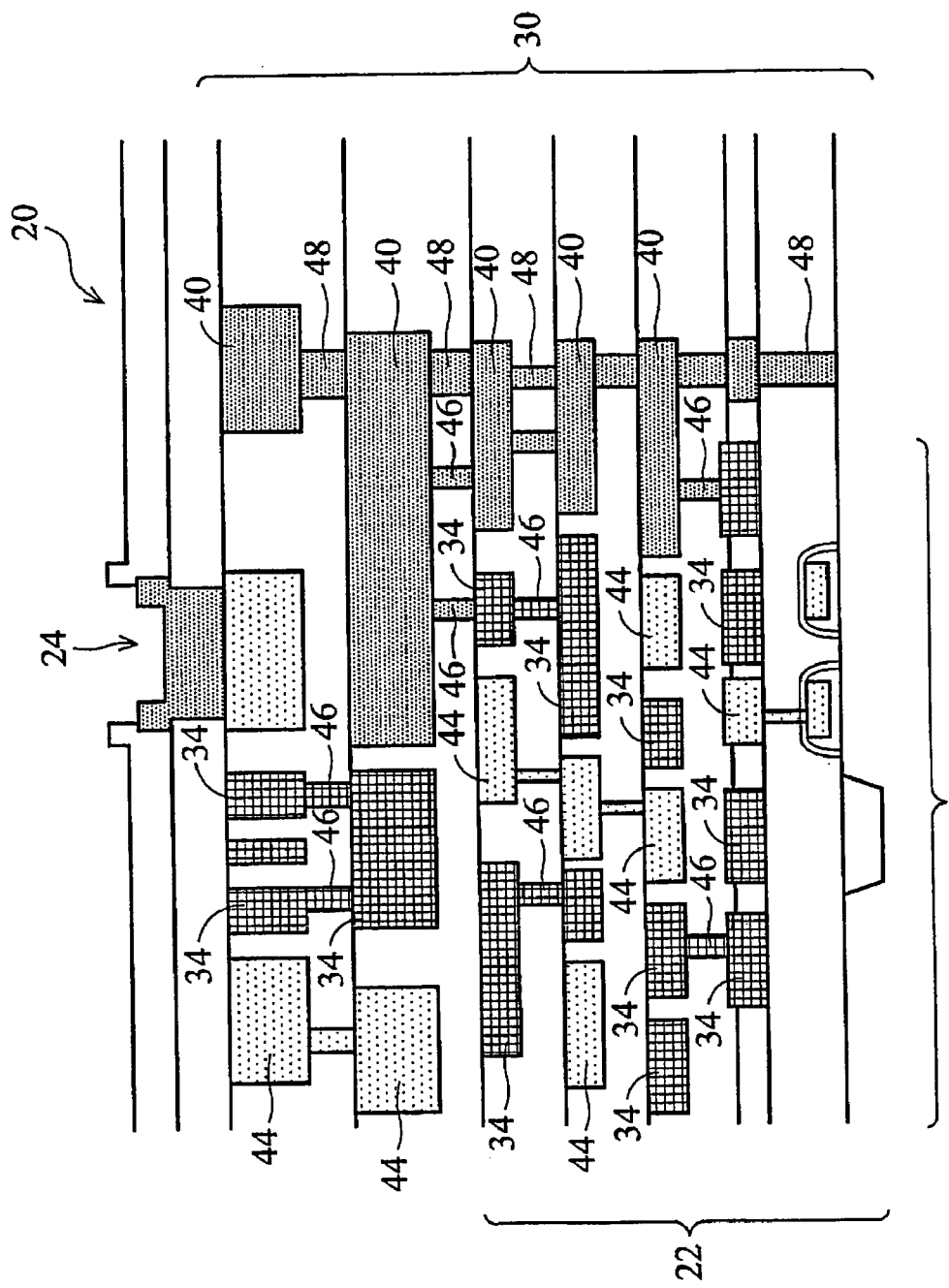
FIGS. 2 and 3 illustrate an integrated circuit chip in accordance with a first illustrative embodiment of the present invention.
Figure 3:
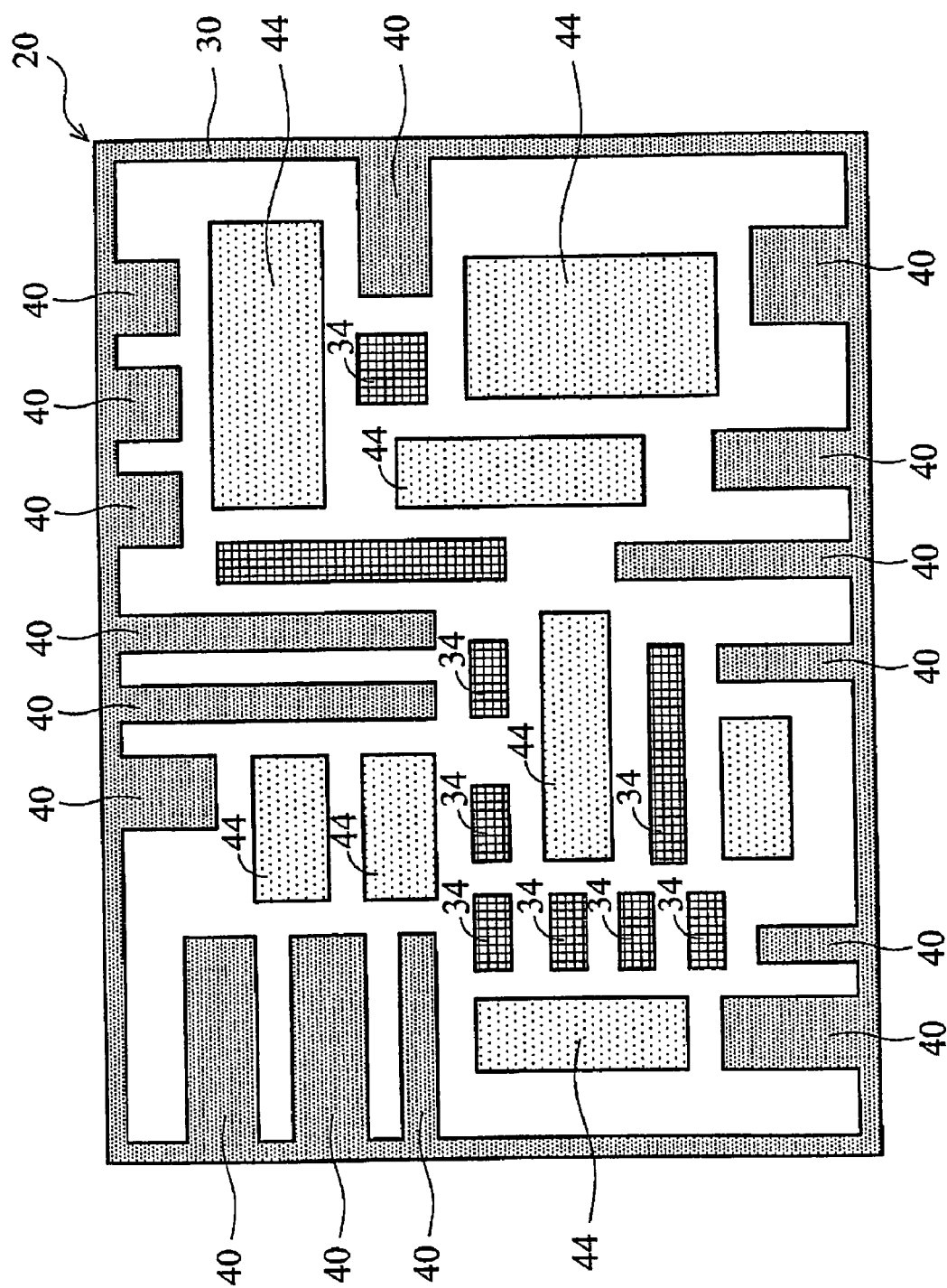

Generally, an embodiment of the present invention provides an integrated circuit chip 20 including a seal ring 30 having dummy structures 40 connected to, joined to, and extending therefrom. FIGS. 2 and 3 illustrate an integrated circuit chip 20 in accordance with a first illustrative embodiment of the present invention. FIG. 2 is a cross-section view showing part of the integrated circuit chip 20 formed on a wafer. More specifically, FIG. 2 is an enlarged view of the chip 20 showing one outer border of chip 20, for purposes of illustration. FIG. 3 is a top view for a horizontal cross-section of the chip 20 to illustrate a layout of one level, for example.

The following discussion of the first embodiment will refer to FIGS. 2 and 3. As shown in FIG. 3, the seal ring 30 extends about a perimeter of the chip 20. For any given level, the seal ring 20 may or may not be continuous about the chip perimeter, i.e., it may have one or more breaks in the structure. In the level shown in FIG. 3, the seal ring 30 is continuous, for example. The material(s) used for the seal ring structure 30 may be the same throughout the seal ring structure 30 or may vary at different locations in the seal ring structure 30. Preferably, the seal ring structure 30 and the dummy structures 34, 40 are formed simultaneously with the formation of other conductors, vias, and/or wiring 44 on that level. In such case, no additional steps for forming the dummy structures 34, 40 and seal ring structure 30 need to be added. Instead, the masks for patterning the conductors, vias, and/or wiring 44 may be modified during a layout stage, for example. In other embodiments, however, part or all of the dummy structures 34, 40 for a level may be formed from different materials than the active wiring/circuits 44 and/or the seal ring 30. Likewise, part or all of the seal ring structure 30 for a level may be formed from different materials than the active wiring/circuits 44 and/or the dummy structures 34, 40. In such cases, one or more extra processing steps may be needed for forming such structures 30, 34, 40, which is less preferred for cost and efficiency reasons. Part or all of the dummy structures 34, 40 for a level may be formed from any suitable material, preferably having relatively higher strength compared to the intermetal dielectric materials, including (but not limited to): conductive material, metal, copper, aluminum, titanium, tungsten, polysilicon, silicon, silicide, compounds thereof, alloys thereof, and combinations thereof, for example. Likewise, part or all of the seal ring structure 30 for a level may be formed from any suitable material, preferably having relatively high strength compared to the intermetal dielectric materials, including (but not limited to): conductive material, metal, copper, aluminum, titanium, tungsten, polysilicon, silicon, silicide, compounds thereof, alloys thereof, and combinations thereof, for example. In the figures shown herein, please note that even though the seal ring structure 30, various portions of the dummy structures 34, 40, and the active wiring 44 may be shaded or cross-hatched differently (merely for purposes of illustrating different portions of the chip 20), some or all of such portions may be formed of identical or similar materials.

As shown in FIGS. 2 and 3, some of the dummy structures 34, especially those further from the seal ring structure 30, are separate from the seal ring structure 30. Preferably, most or all of the dummy structures 40 adjacent to the seal ring structure 30 are joined or connected to the seal ring structure 30 to extend therefrom into the active circuit area 32 of the chip 20, as shown in FIGS. 2 and 3, for example. The dummy structures 34, 40 are placed between and adjacent to active circuit portions 44 of the integrated circuit, as well as between bond pad structures 24. The dummy structures 34, 40 may vary in shape and size. Preferably, the dummy structures 34, 40 will be maximized in accordance with design rules for the layout of the chip 20.

In the first embodiment shown in FIGS. 2 and 3, at least part of the integrated circuit 22, which is formed in the active area 32 of the chip 20, is located under the bond pads 24. Although embodiments are shown herein where at least part of the integrated circuit 22 is formed under at least one bond pad structure 24 (see e.g., FIG. 2), an embodiment of the present invention may be implemented in a case where the bond pads 24 are not located over integrated circuits (i.e., not a CUP design).

As shown in FIG. 2, dummy vias 46 are part of the dummy structures 34, 40 and connect between adjacent dummy structures 34, 40 that overlap vertically. This provides vertical interconnection between the dummy structures 34, 40, which further enhances the strength of the chip's structure. In other embodiments (not shown), such vias 46 may not be used. Series of vias 46 may be used between several levels to form dummy pillars (vertically oriented) to further enhance the strength added by the network of dummy structures 34, 40. Series of horizontally and/or vertically displaced vias 48 may also be used in connecting between different levels of the seal ring structure 30, as part of the seal ring structure 30. Such vias 46 for the dummy structures 34, 40 and/or the seal ring structure 30 may be formed simultaneously with other structures of the chip 20 (e.g., vias of the active circuitry 44) to avoid needing extra steps for forming such structures, for example.

Preferably, the seal ring structure 30 is formed from top to bottom, as shown in FIG. 2, with different levels of the seal ring structure 30 being connected and joined by successive levels of rings and/or vias 48 in the seal ring structure 30. However, in other embodiments (not shown), upper and lower portions of a seal ring structure 30 may not be connected or joined (except possibly indirectly by dummy structures 40 and/or dummy vias 46). Also, the seal ring structure 30 may be formed at only selected levels of the chip 20 (e.g., only upper portion, only middle portion, only lower portion, only upper and lower portions, etc.) in other embodiments (not shown), for example.

An embodiment of the present invention may provide numerous advantages, including one or more of (but not necessarily limited to):

Increasing the overall strength of the chip;
Increasing adhesion strength to prevent peeling;
Allowing for narrower cutting streets between chips;
Preventing or reducing amount of delamination and damage during cutting or dicing chips from wafer;
Preventing or reducing likelihood of cracking from compressive stresses exerted on chip;
Increasing amount of stress that a chip can handle;
Preventing or reducing amount of damage to chip during wire bonding processes;
Implementing an embodiment with no added fabrication steps (other than layout or design steps);
Improving output yield and reliability; and
Increasing options for implementing weaker low-k dielectric materials.

It is preferred, but not required, that as many of the dummy structures 40 as possible are joined with the seal ring structure 30 on each level to maximize the integration of the dummy structures 40 and the seal ring structure 30. Such maximization may be accomplished using a computer algorithm or a software tool included in a layout tool during lay out of each layer. This is illustrated in FIGS. 4–7 in describing a layout process for a second illustrative embodiment of the present invention. FIGS. 4–7 will be used to describe the use of a software tool for automatically laying out the dummy structures for a given level using predetermined layout design rules. Such predetermined layout design rules may take into account factors and criteria, such as (but not limited to and not necessarily using all of these listed): intermetal dielectric material(s) used at that level; material(s) selected for active wiring at that level; material selected for via at that level; material selected for adjacent structure(s); generation of technology (e.g., 90 nm, 65 nm, etc.); size of wiring; parasitic capacitances among different levels and among adjacent lines/structures; spacing required between adjacent structure(s); minimum size formable using selected photolithography process(es); and combinations thereof, for example.

Figure 4:
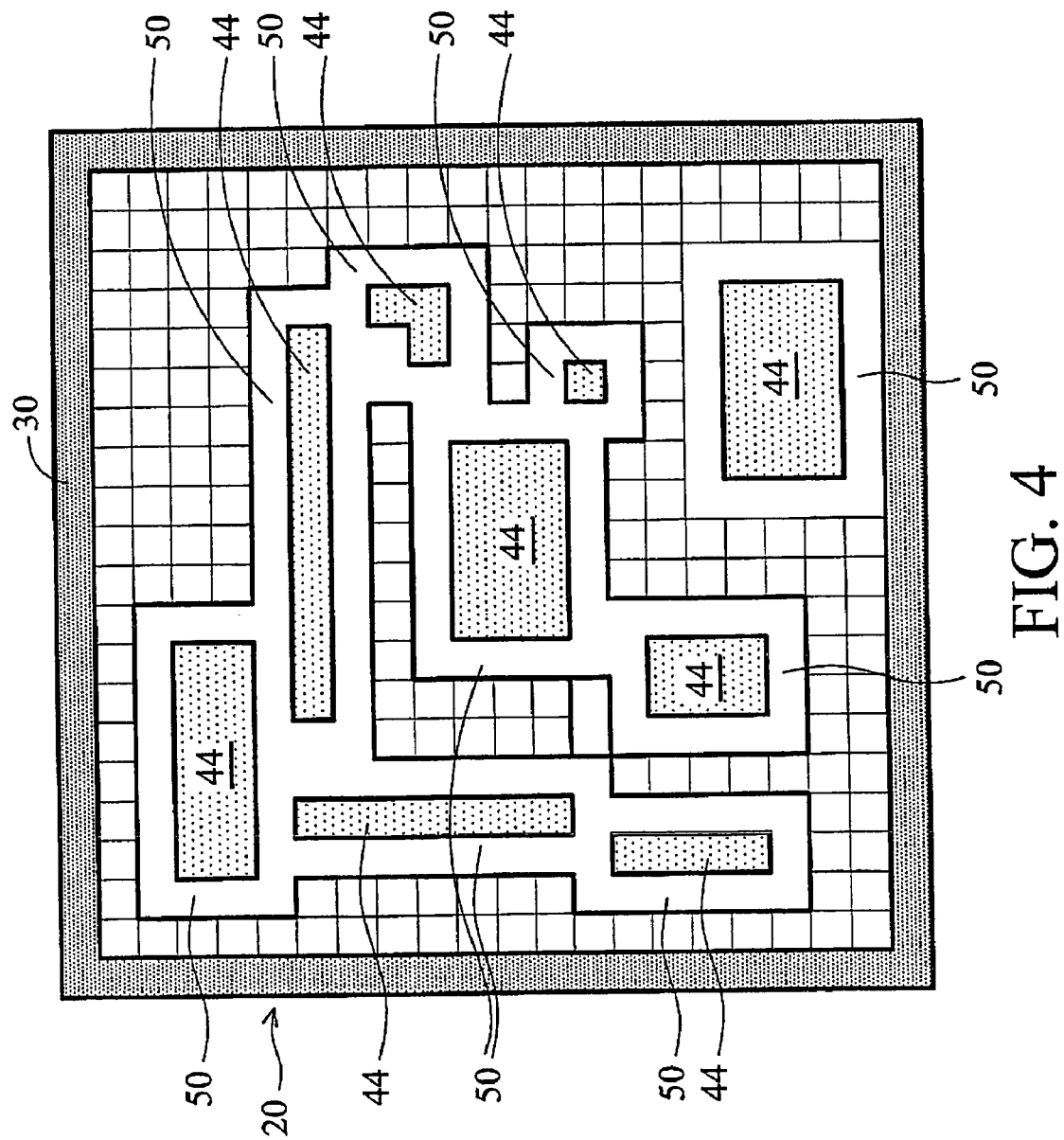
FIGS. 4–7 illustrate a layout process for a second illustrative embodiment of the present invention.

FIGS. 4–7 are top view layouts for a single level of an example integrated circuit chip 20, at a level with active wiring 44, and at different stages of the layout. In FIG. 4, the active wiring 44 is shown for the given level. Also, a portion of the seal ring structure 30 for that level is shown in FIG. 4. Each portion of the active wiring 44 has a border 50 placed around it, which represents the minimum spacing around the wiring 44 required by the design rules. Such border 50 may or may not be displayed during an actual use of a layout tool incorporating this feature.

Figure 5:
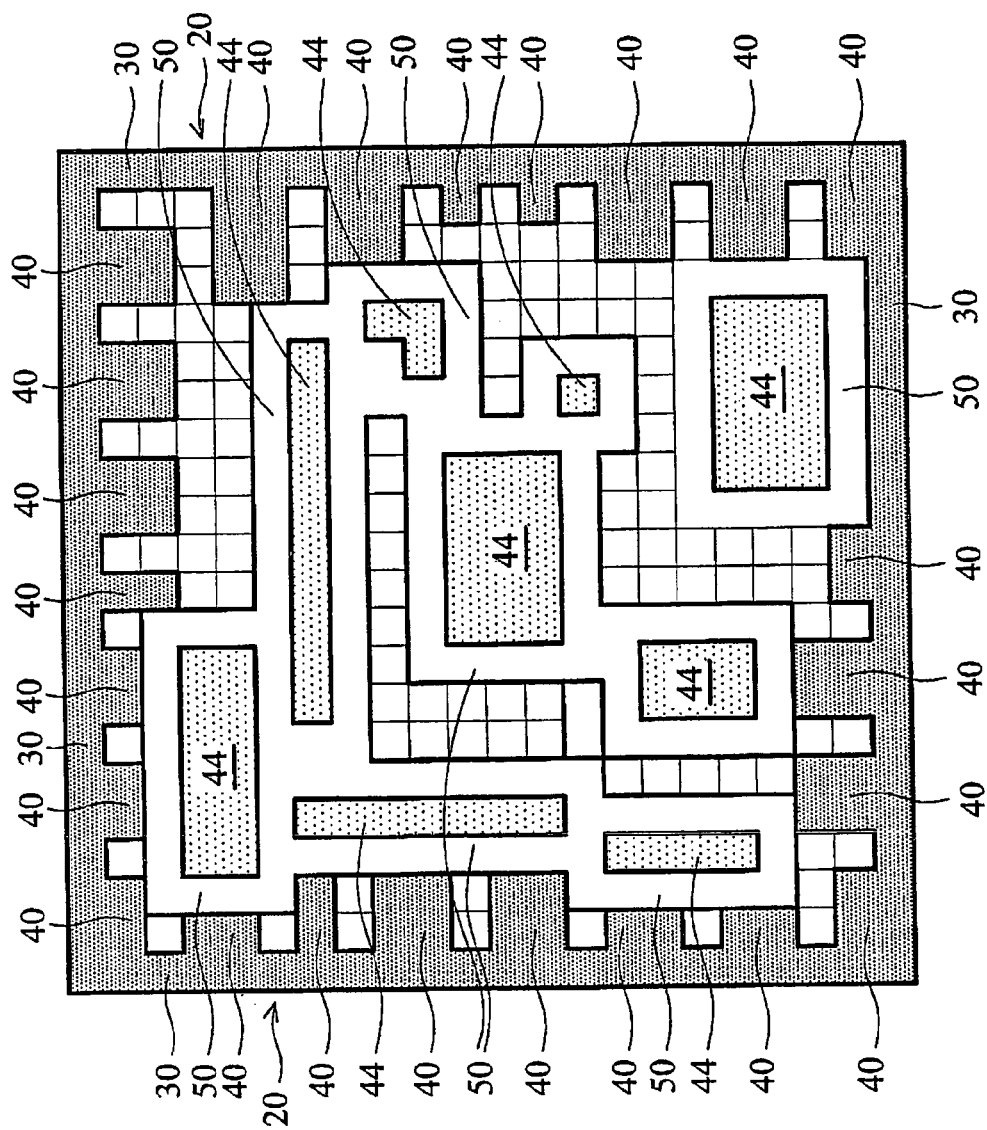
Figure 6:
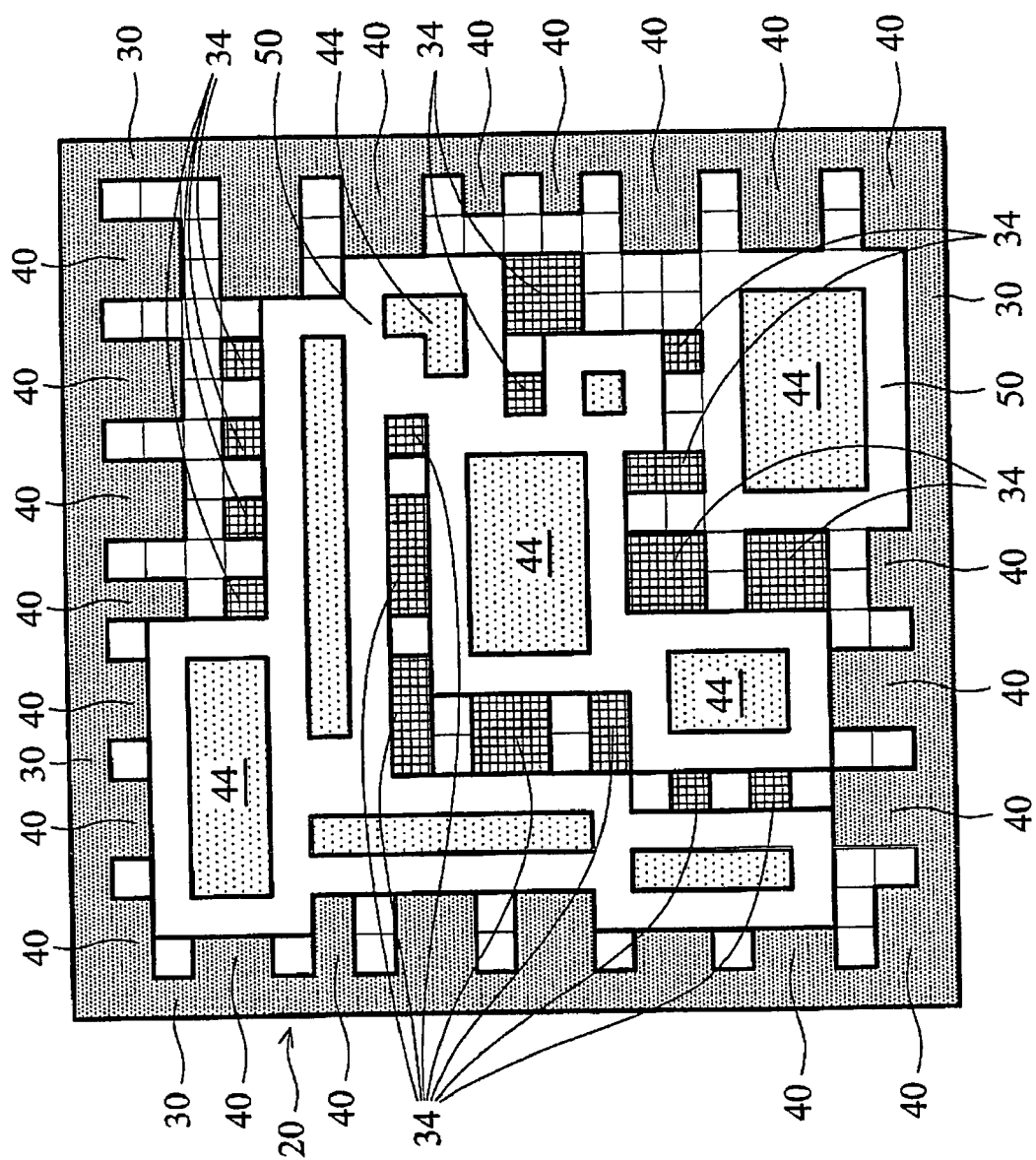
Figure 7:
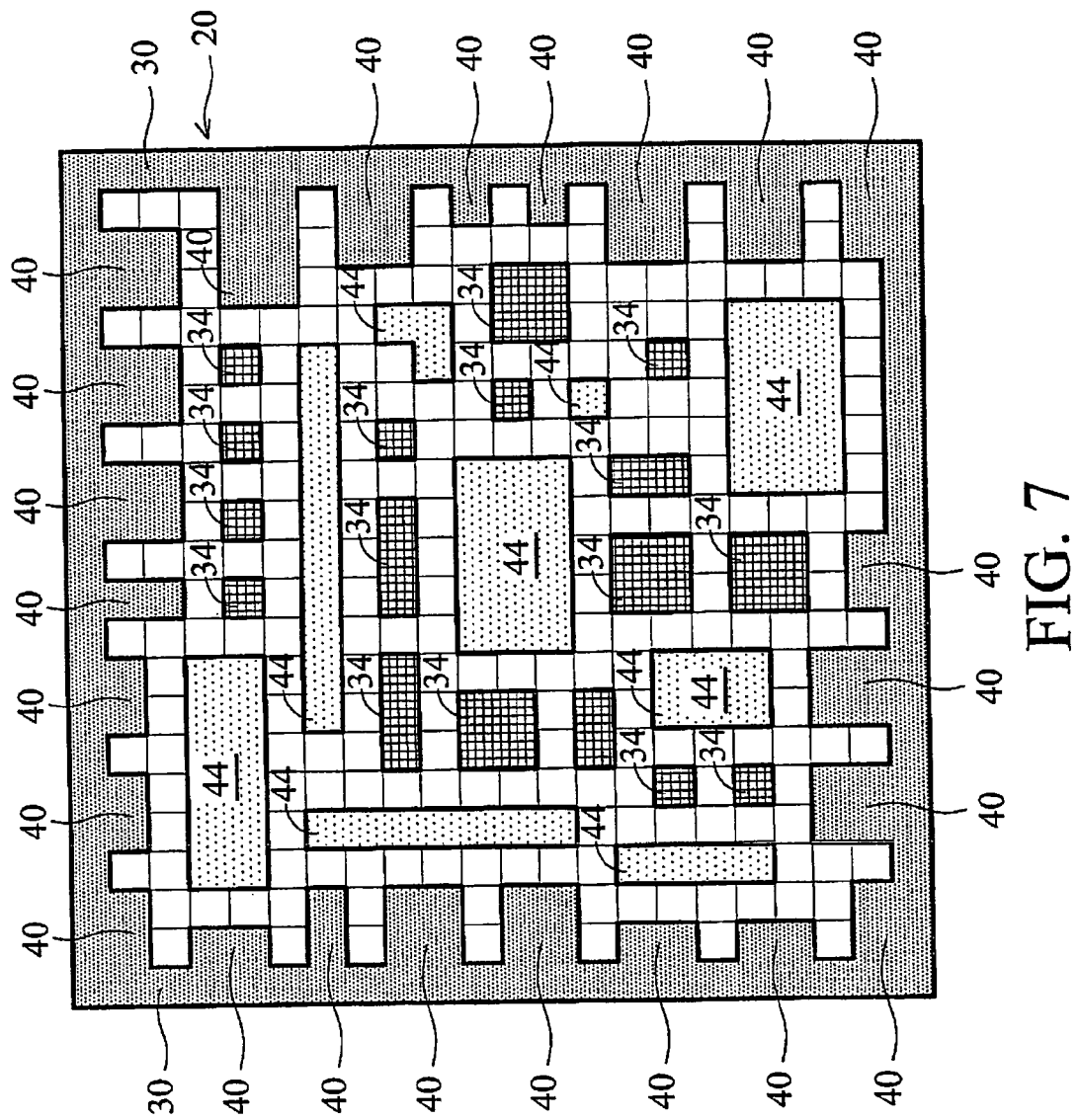

In FIG. 5, portions of dummy structures 40 are extended from the seal ring structure 30 in accordance with design rules, which may vary for other embodiments. Next, the remaining spaces are filled in by portions of dummy structures 34 that are not directly connected to the seal ring structure 30 (see FIG. 6), although some may be indirectly connected to the seal ring structure 30 by other connected dummy structures 40 on other levels (e.g., above and/or below), which are not shown in FIGS. 4–7. When the borders 50 are removed from the active wiring 44, the resulting layout for that level is provided, as shown in FIG. 7.

Even though the dummy structures 34 that are not directly connected to the seal ring structure 30 are laid out after the dummy structures 40 that are directly connected to the seal ring structure 30 in this embodiment (see FIGS. 5 and 6), this need not be the case in other embodiments (not shown). For example, in another embodiment of the present invention (not shown), the dummy structures 34 that are not directly connected to the seal ring structure 30 may be laid out prior to, simultaneously with, or in conjunction with laying out the dummy structures 40 that are directly connected to the seal ring structure 30. Also, the dummy structures 34 that are not directly connected to the seal ring structure 30 may be laid out in stages in other embodiments (not shown). For example, the dummy structures 34 that are not directly connected to the seal ring structure 30 may be laid out in order of size (e.g., placing larger sized blocks first and then filling in remaining spaces with smaller blocks). Also, the lay out of one or more levels may be dependent upon the layout of one or more other levels to maximize the use of dummy vias 46 and/or dummy pillars. Hence, a layout tool may be programmed to perform such tasks automatically during a layout process in accordance with predetermined layout design rules including or incorporated into the software algorithms for making decisions on layout placements.

In accordance with an aspect of the present invention, a method of making an integrated circuit chip is provided. This method includes the following steps described in this paragraph. The order of the steps may vary, may be sequential, may overlap, may be in parallel, and combinations thereof. An integrated circuit is formed in an active area of the chip. A seal ring structure is formed at least partially around the active circuit area. While forming a level of the seal ring structure, a first dummy structure is formed that extends from the seal ring structure into the active circuit area. A portion of wiring for the integrated circuit may be formed while forming the level of the seal ring structure and while forming the first dummy structure. The first dummy structure may extend between part of the wiring of the integrated circuit The level of the seal ring structure, the first dummy structure, and the portion of the wiring of the integrated circuit may be formed from a same material.

In accordance with another aspect of the present invention, a method of making an integrated circuit chip is provided. This method includes the following steps described in this paragraph. The order of the steps may vary, may be sequential, may overlap, may be in parallel, and combinations thereof. Wiring is formed at a certain level for an integrated circuit in an active area of the chip. At least part of a seal ring structure is formed at least partially around the active circuit area at the certain level. Dummy structures are formed that extend from the seal ring structure into the active circuit area at the certain level. Placements of the dummy structures are selected to minimize dielectric material areas between the wiring and the seal ring at the certain level. The selecting of the placements of the dummy structures may be performed automatically using a software algorithm. The selecting of the placements using the software algorithm may be performed in accordance with at least one predetermined design rule. The selecting of the placements using the software algorithm may be performed by a layout tool during a layout process.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit chip comprising:
   an active circuit area;
   an integrated circuit formed in the active circuit area;
   a seal ring structure formed at least partially around the active circuit area;
   a first dummy structure extending from the seal ring structure into the active circuit area; and
   a second dummy structure, wherein at least part of the second dummy structure is located under at least part of the first dummy structure.

2. The integrated circuit chip of claim 1, further comprising a bond pad formed in the active circuit area, wherein at least part of the integrated circuit is located under the bond pad.

3. The integrated circuit chip of claim 2, wherein at least part of the integrated circuit is located under at least part of the first dummy structure.

4. The integrated circuit chip of claim 1, wherein the first dummy structure extends between active wiring in the active circuit area.

5. The integrated circuit chip of claim 1, wherein the second dummy structure extends from the seal ring structure into the active circuit area.

6. The integrated circuit chip of claim 1, further comprising a dummy via connecting between the first dummy structure and the second dummy structure.

7. The integrated circuit chip of claim 1, further comprising a third dummy structure from the seal ring structure into the active circuit area, wherein the third dummy structure is located on a same level as the first dummy structure.

8. The integrated circuit chip of claim 1, further comprising:
   a third dummy structure located in the active circuit area, the third dummy structure being located on a same level as the first dummy structure, and the third dummy structure being separate from the first dummy structure and the seal ring structure.

9. The integrated circuit chip of claim 8, wherein the third dummy structure is located between two portions of active wiring.

10. The integrated circuit chip of claim 1, wherein the first dummy structure comprises a same material as at least part of the seal ring structure.

11. The integrated circuit chip of claim 1, wherein the first dummy structure comprises a material selected from a group consisting of conductive material, metal, copper, tungsten, aluminum, polysilicon, silicide, a material that is stronger than an adjacent dielectric material, alloys thereof, and combinations thereof.

12. An integrated circuit chip comprising:
    an active circuit area;
    an integrated circuit formed in the active circuit area;
    a seal ring structure formed at least partially around the active circuit area;
    a first dummy structure extending from the seal ring structure into the active circuit area;
    a second dummy structure extending from the seal ring structure into the active circuit area, wherein at least part of the second dummy structure being located under at least part of the first dummy structure; and
    a dummy via connecting between the first dummy structure and the second dummy structure.

13. The integrated circuit chip of claim 12, further comprising a bond pad formed in the active circuit area, wherein at least part of the integrated circuit is located under the bond pad.

14. The integrated circuit chip of claim 12, wherein at least part of the integrated circuit is located under at least part of the second dummy structure.

15. The integrated circuit chip of claim 12, wherein the first dummy structure extends between active wiring in the active circuit area.

16. The integrated circuit chip of claim 12, wherein the second dummy structure extends between active wiring in the active circuit area.

17. The integrated circuit chip of claim 12, further comprising:
    a third dummy structure located in the active circuit area, the third dummy structure being located on a same level as the first dummy structure, and the third dummy structure being separate from the first dummy structure and the seal ring structure.

18. The integrated circuit chip of claim 17, wherein the third dummy structure is located between two portions of active wiring.

19. The integrated circuit chip of claim 12, wherein the first dummy structure and the second dummy structure each comprises a same material as at least part of the seal ring structure.

20. An integrated circuit chip comprising:
    an active circuit area;
    an integrated circuit formed in the active circuit area;
    a bond pad formed in the active circuit area, wherein at least part of the integrated circuit is located under the bond pad;
    a seal ring structure formed at least partially around the active circuit area; and
    a first dummy structure extending from the seal ring structure into the active circuit area, wherein at least part of the first dummy structure is located under the bond pad and wherein at least part of the integrated circuit is located under at least part of the first dummy structure.

* * * * *